United States Patent
Marron et al.

(10) Patent No.: US 7,259,860 B2
(45) Date of Patent: Aug. 21, 2007

(54) OPTICAL FEEDBACK FROM MODE-SELECTIVE TUNER

(75) Inventors: Joseph Marron, Pittsford, NY (US); Nestor Farmiga, Rochester, NY (US); Andrew W. Kulawiec, Fairport, NY (US); Thomas J. Dunn, Penfield, NY (US)

(73) Assignee: Corning Incorporated, Corning, NY (US)

( * ) Notice: Subject to any disclaimer, the term of this patent is extended or adjusted under 35 U.S.C. 154(b) by 197 days.

(21) Appl. No.: 10/946,691

(22) Filed: Sep. 22, 2004

(65) Prior Publication Data

US 2006/0062260 A1 Mar. 23, 2006

(51) Int. Cl.
*G01B 9/02* (2006.01)
*G01J 3/45* (2006.01)

(52) U.S. Cl. ...................................... 356/451

(58) Field of Classification Search ............... 356/450, 356/451; 372/20
See application file for complete search history.

(56) References Cited

U.S. PATENT DOCUMENTS

| | | | | |
|---|---|---|---|---|
| 4,173,442 A * | 11/1979 | Snyder | ...................... | 356/454 |
| 4,594,003 A | 6/1986 | Sommargren | ................ | 356/359 |
| 5,387,973 A * | 2/1995 | Sillitto | ........................ | 356/521 |
| 5,473,434 A | 12/1995 | de Groot | ..................... | 356/359 |
| 5,488,477 A | 1/1996 | de Groot | ..................... | 356/359 |
| 5,502,566 A | 3/1996 | Ai et al. | ...................... | 356/359 |
| 6,006,128 A | 12/1999 | Izatt et al. | ................... | 600/476 |
| 6,028,670 A | 2/2000 | Deck | ........................... | 356/359 |
| 6,359,692 B1 | 3/2002 | de Groot | .................... | 356/512 |
| 6,690,690 B2 | 2/2004 | Marron | ........................ | 372/20 |
| 6,882,432 B2 | 4/2005 | Deck | ........................... | 356/512 |
| 6,894,788 B2 * | 5/2005 | Deck | ........................... | 356/513 |
| 6,924,898 B2 | 8/2005 | Deck | ........................... | 356/512 |
| 6,995,848 B2 * | 2/2006 | Deck | ........................... | 356/512 |
| 2003/0160968 A1 | 8/2003 | Deck | ........................... | 356/515 |
| 2003/0164951 A1 | 9/2003 | Deck | ........................... | 356/519 |

OTHER PUBLICATIONS

"Generalized Data Reduction for Heterodyne Interferometry" by J.E. Greivenkamp, Optical Engineering, 23(4), 350-352, Jul./Aug. 1984.

* cited by examiner

*Primary Examiner*—Patrick Connolly
(74) *Attorney, Agent, or Firm*—Timothy M. Schaeberle

(57) ABSTRACT

A mode-monitoring system used in connection with discrete beam frequency tunable laser provides optical feedback that can be used for adjusting the laser or for other processing associated with the use of the laser. For example, the output of a frequency tunable source for a frequency-shifting interferometer can be monitored to support the acquisition or processing of more accurate interference data. A first interferometer for taking desired measurements of optical path length differences traveled by different portions of a measuring beam can be linked to a second interferometer for taking measurements of the measuring beam itself. The additional interference data can be interpreted in accordance with the invention to provide measures of beam frequency and intensity.

7 Claims, 1 Drawing Sheet

OPTICAL FEEDBACK FROM MODE-SELECTIVE TUNER

BACKGROUND OF THE INVENTION

1. Field of the Invention

The invention relates to optical feedback systems, including beam monitors for acquiring information for adjusting the output of coherent beam sources or for processing interference data related to the characteristics of measuring beams. For example, measuring beam frequency and intensity information can be acquired from the measurement of phase variations apparent from other interference data. Particular applicability is found for use of the frequency and intensity information with the tunable sources of frequency-shifting interferometers.

2. Description of Related Art

Interferometers, particularly frequency-shifting interferometers, rely on assumptions regarding measuring beam frequency for interpreting interference information. For example, interference patterns are generally interpreted on a pixel-by-pixel basis by converting intensity information into modulo $2\pi$ phase offsets between the interfering portions of the measuring beam. The angular measures of phase are then converted into measures of distance as fractional portions of the measuring beam wavelength.

Frequency-shifting interferometers convert the intensity information of interference patterns into measures of distance by producing a succession of interference patterns at different measuring beam frequencies. Pixel intensity data fluctuates in accordance with the change in measuring beam frequency at different rates corresponding to the distance offset between the interfering portions of the measuring beam. Calculations generally assume that the succession of interference patterns are produced by evenly spaced measuring beam frequencies, and measurement accuracy depends upon the correctness of this assumption. Measurement accuracy also depends upon the assumption of an invariant overall intensity of the different measuring beams.

BRIEF SUMMARY OF THE INVENTION

The invention in one or more of its preferred embodiments monitors the measuring beams of interferometers to support the acquisition or processing of accurate interference data. In addition to a first interferometer for taking desired measurements of optical path length differences traveled by different portions of a measuring beam, a second interferometer can be used in accordance with the invention for taking measurements of the measuring beam itself. The additional interference data can be interpreted in accordance with the invention to provide measures of beam frequency and intensity, which can be used to support the acquisition or processing of interference data by the first interferometer.

The first interferometer can be frequency-shifting interferometer in which the interference effects of progressive changes in measuring beam frequency are interpreted as measures of distance, and the second interferometer can be a distance-shifting interferometer in which the interference effects of progressive changes in distance are interpreted as measures of beam frequency. Particular benefit is derived from the invention for use with such frequency-shifting interferometers having coherent light sources that are tunable through a series of measuring beam frequencies. For example, co-assigned US Application entitled MODE-SELECTIVE FREQUENCY TUNING SYSTEM filed on even date herewith discloses a laser light source that is tunable through a series of measuring beam frequencies corresponding to choices among resonant modes of a lasing cavity. The distance-shifting interferometer can be arranged with a measuring cavity or other structure for temporally spacing different portions of the measuring beam. The measuring cavity can have a defined relationship with a lasing cavity of the coherent light source for monitoring the series of measuring beam frequencies.

For example, beam frequencies can be measured in accordance with the invention using a common-path (e.g., Fizeau) interferometer. A measuring cavity of the interferometer has two partially reflective reference surfaces spaced apart within the coherence length of the measuring beam. One reference surface departs in a regular fashion from the other (e.g., is inclined slightly to the other) to produce one or more fringes for carrying out a distance-shifting function. The interference fringe pattern, which is based on overlapping reflections from the two reference surfaces, is imaged onto a detector, such as onto an array of sensors. The reference surfaces of the cavity are preferably planar, so that under the conditions of relative tilt between the surfaces (i.e., a slight departure from parallelism), the interference pattern appears as a pattern of parallel fringes, and the array of detectors is oriented in a direction of fringe variation to monitor changes in the location of the fringes.

The measuring cavity can be matched to the lasing cavity so that the phase offset of the fringes produced by the measuring cavity remains constant for measuring beams at the intended frequency modes of the lasing cavity. Any departure of the measuring beams from their intended frequency modes is apparent as a phase shift that can be converted into a measure of beam frequency variation. The size of the measuring cavity, corresponding to its free spectral range, can be set in relation to the frequency spacing between the lasing cavity modes, also corresponding to its free spectral range, to resolve measuring ambiguities or achieve desired measuring accuracy.

One embodiment of the invention as a mode-monitoring system for a laser includes a lasing cavity of the laser having a first optical path length defining a series of nominal beam frequency modes subject to amplification. A tuner incrementally varies output of the laser among the nominal beam frequency modes. A measuring cavity, which is optically connected to the lasing cavity, has reference surfaces that are nominally spaced through a second optical path length defining a free spectral range that is related to an intended frequency spacing between the nominal beam frequency modes. The detector receives output from the measuring cavity in the form of interference patterns for detecting phase-offset variations between the beam frequencies output from the laser.

Preferably, the first optical path length of the lasing cavity and the second optical path length of the measuring cavity are related by an integer multiple. A processor can be arranged to receive information from both the tuner and the detector for measuring a beam frequency shift between one or more beam frequency modes. Relying on information from the tuner to determine the approximate beam frequency shift (i.e., both direction and approximate magnitude), the free spectral range of the measuring cavity can be set as an even division of the frequency spacing between the nominal beam frequency modes to optimize the accuracy of the frequency measurements. Alternatively, the measuring cavity or, preferably, a second measuring cavity can be arranged with a larger free spectral range to resolve any ambiguity in the direction or approximate magnitude of the frequency shift.

Another embodiment of the invention as an interferometric measuring system with optical feedback includes both a frequency-shifting interferometer and a distance-shifting interferometer. The frequency-shifting interferometer measures height variations between corresponding points on test and reference surfaces by collecting interference data for each of the points at a plurality of measuring beam frequencies. The distance-shifting interferometer measures frequency variations between the plurality of measuring beam frequencies by collecting interference data for each of the frequencies at a plurality of corresponding points on two reference surfaces. A processor converts the interference data for each of the frequencies into measures of the beam frequency variations and incorporates the measures of the beam frequency variations into procedures for converting the interference data for each of the points into measures of the height variations between the corresponding points of the test and reference surfaces.

In addition, the processor can be arranged for converting the same interference data for each of the frequencies into measures of beam intensity variations and for incorporating the measures of beam intensity variations into procedures for converting the interference data for each of the points into measures of the height variations between the corresponding points of the test and reference surfaces. For example, the measures of the beam intensity variations can be used to normalize pixel intensity data between the different measuring beam frequencies.

Yet another embodiment of the invention as a beam monitoring system for a mode-selective tuner includes a beamsplitter for diverting a portion of each of a plurality of measuring beams that are output from the mode-selective tuner at different frequency modes. A distance-shifting interferometer for producing interference patterns at each of the different frequency modes includes a pair of reference surfaces that establish (a) a nominal optical path length difference between interfering parts of the diverted measuring beam portion and (b) a variation in the nominal optical path length difference between corresponding points on the two reference surfaces spanning nearly at least one fringe of the interference patterns. A detector samples the interference patterns at the corresponding points on the two reference surfaces, and a processor converts variations in the interference patterns into measures of beam frequency variation.

The detector preferably includes an array of sensors that can be oriented in a direction of fringe variation within the interference patterns. The sensors are spaced apart by fractional parts of a fringe for gathering intensity information that can be converted into measures of phase offsets for the different measuring beams. For example, the processor preferably employs a conventional phase-shifting algorithm for converting the intensity information from the sensors into the measures of phase offsets. The array of sensors is preferably rotatable for adjusting the fringe spacing between the detectors for assisting in the conversion of the intensity information into measures of phase offsets.

The processor can gather information from the mode-selective tuner in addition to information from the detector to provide unambiguous measures of beam frequency shifts between the different frequency modes. The processor can also be arranged to provide feedback to the mode-selective tuner for adjusting the frequency output of the mode-selective tuner.

BRIEF DESCRIPTION OF THE SEVERAL VIEWS OF THE DRAWING(S)

DETAILED DESCRIPTION OF THE INVENTION

Figure 1:
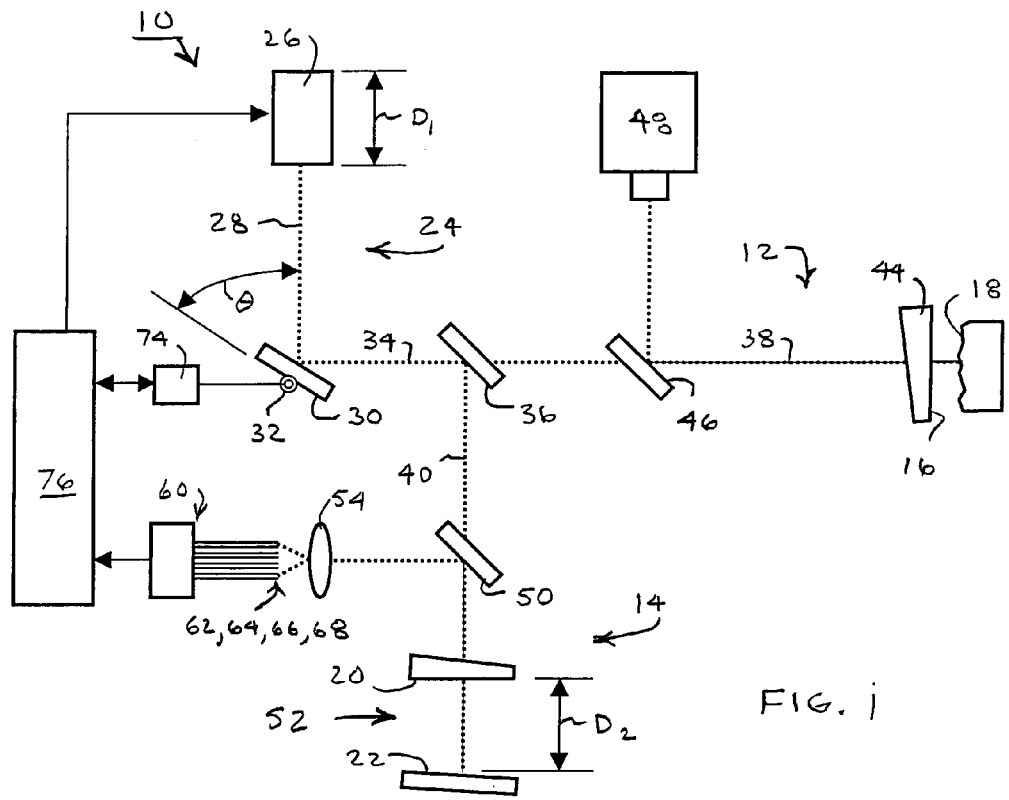
FIG. 1 is a diagram of an interferometric measuring system that combines a frequency-shifting interferometer for measuring distances with a distance-shifting interferometer for measuring beam frequencies.

An interferometric measuring system 10 with optical feedback is shown in FIG. 1 as a combination of two interferometers 12 and 14. The interferometer 12 is a frequency-shifting interferometer that measures height variations between corresponding points on reference and test surfaces 16 and 18 by collecting interference data for each of the points at a plurality of measuring beam frequencies. The interferometer 14 is a distance-shifting interferometer that measures frequency variations between the plurality of measuring beam frequencies by collecting interference data for each of the frequencies at a plurality of corresponding points on two reference surfaces 20 and 22.

A preferred coherent light source for both interferometers 12 and 14 is a mode-selective frequency-tunable laser 24, which includes a lasing cavity 26 and a feedback cavity 28. The lasing cavity 26 has a first optical path length $D_1$ defining a series of nominal beam frequency modes that are subject to amplification. A free spectral range (FSR) of the lasing cavity 26 corresponds to a frequency spacing $\Delta v_1$ between the nominal beam frequency modes as given by the following expression:

$$\Delta v_1 = \frac{c}{2D_1}$$

where c is the speed of light.

A frequency adjuster shown as an angularly adjustable diffraction grating 30 forms one end of the feedback cavity 28 and is adjustable about a pivot axis 32 through a range of angles θ for selecting among the nominal beam frequency modes for output from the frequency-tunable laser 24. The angularly adjustable diffraction grating 30 retroreflects light of a first diffraction order back into the lasing cavity 26 for influencing the lasing frequency subject to the least loss. Different frequencies are returned to the lasing cavity 26 as a function of the inclination angle θ of the diffraction grating 30. For purposes of simplifying data processing operations of the frequency-shifting interferometer 12, the diffraction grating 30 can be pivoted between positions for selecting among the nominal beam frequency modes favored by the lasing cavity 26 for varying the frequency output of the frequency-tunable laser 24 by one or more increments of the mode spacing $\Delta v_1$. Zero order reflections from the diffraction grating 30 reflect a measuring beam 34 in a different direction as the output of the frequency-tunable laser 24. A folding mirror (not shown) moves together with the diffraction grating 30 to maintain a single output direction for the measuring beam. Such folding mirrors are shown in U.S.

Pat. No. 6,690,690, entitled TUNABLE LASER SYSTEM HAVING AN ADJUSTABLE EXTERNAL CAVITY, which is hereby incorporated by reference.

Additional details of such frequency-tunable lasers are given in co-assigned US Application entitled MODE-SELECTIVE FREQUENCY TUNING SYSTEM filed on even date herewith, which is hereby incorporated by reference. Other frequency tunable lasers can also be used in accordance with the invention including continuously tunable lasers, which can be arranged to output a plurality of discrete beam frequencies.

A beamsplitter 36 divides the measuring beam 34 emitted from the mode-selective frequency-tunable laser 24 into a primary measuring beam 38 that propagates through the frequency-shifting interferometer 12 and a secondary measuring beam 40 that propagates through the distance-shifting interferometer 14. Most of the light preferably transmits through the beamsplitter 36 to the frequency-shifting interferometer 12 as the primary measuring beam 38, and a small percentage of the light preferably reflects from the beamsplitter 36 to the distance-shifting interferometer 14 as the secondary measuring beam 40. An inclined glass plate or other partial reflector can be used for this purpose. The reflecting and transmitting functions of the beamsplitter 22 could be reversed while providing a similar division of the measuring beam 34.

Alternatively, light from the measuring beam 34 could be extracted from within the frequency-shifting interferometer 12 such as by collecting light within the field of view of the interferometer 12 adjacent to the test surface 18. Such light would preferably be extracted from a transverse portion of the measuring beam 34 outside a common area in which interference is formed between reflections from the reference and test surfaces 16 and 18. In fact, light can be extracted within the frequency-shifting interferometer 12 from any of the transverse areas of the measuring beam 34 that are not involved in the actual measurement of the test surface 18.

The frequency-shifting interferometer 12 has the form of a common path interferometer (e.g., a Fizeau interferometer) for propagating the primary measuring beam 38 along a common path to the reference surface 16 formed on an objective 44. One portion of the primary measuring beam 38 reflects from the reference surface 16 as a reference beam, and another portion of the primary measuring beam 38 transmits through the reference surface 16 and reflects from the test surface 18 as a test beam. Another beamsplitter 46, which allows for the passage of the primary measuring beam 38 to the reference and test surfaces 16 and 18, directs the returning reference and test beams to a camera 48 that records interference patterns between the reference and test beams as images of the test surface 18. A separate interference pattern is recorded for each of the plurality of measuring beam frequencies emitted from the frequency tunable laser 24.

The distance-shifting interferometer 14 also has the form of a common path interferometer for propagating the secondary measuring beam 40 along a common path to a measuring cavity 52 bounded by the two reference surfaces 20 and 22 that are nominally spaced through a second optical path length $D_2$. Both of the reference surfaces 20 and 22 are at least partially reflective for returning different portions of the secondary measuring beam 40. However, the reference surface 20 is partially transmissive to admit light into the cavity 52 and to emit light from the cavity 52. The reference surface 20 reflects a portion of the secondary measuring beam 40 as a first reference beam. The reference surface 22 reflects another portion of the secondary measuring beam 40 as a second reference beam. The two reference beams are temporally offset through approximately twice the second optical path length $D_2$ and interfere with each other forming a comparison between the two reference surfaces 20 and 22.

A beamsplitter 50, which allows passage of the secondary measuring beam 40 to the two reference surfaces 20 and 22, directs the interfering reference beams returning from the cavity 52 through imaging optics 54 onto a detector 60. Both reference surfaces 20 and 22 are preferably planar or otherwise similar in form, except that the reference surface 22 is relatively inclined to the reference surface 20 to produce an interference fringe pattern of straight parallel fringes. However, unlike the frequency-shifting interferometer 12, the imaged interference patterns of the distance-shifting interferometer 14 are not intended for measuring differences between surfaces but for measuring changes in the characteristics of the measuring beam 34.

Figure 2:
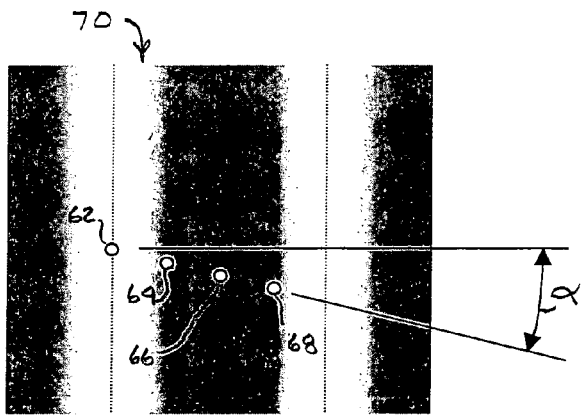
FIG. 2 is an illustration of an interference pattern produced by a measuring cavity of the distance-shifting interferometer along with a linear array of sensors for sampling intensities at equal divisions of a fringe.

The detector 60 preferably takes the form of a linear array of sensors. For example, four closely bound fibers 62, 64, 66, and 68 of the detector 60 collect light for sampling data points within the interference pattern at a predetermined spacing. FIG. 2 shows such an interference pattern 70 having a width of two fringes. Preferably, the reference surfaces 20 and 22 are relatively inclined to one another such that the linear array of fibers 62, 64, 66, and 68 spans approximately one fringe spacing. In addition, the linear array of fibers 62, 64, 66, and 68 is angularly adjustable through an angle $\alpha$, so that the four fibers can be spaced at equal $\pi/2$ radian (90 degree) intervals of a single cycle of constructive and destructive interference (i.e., equal divisions of a single fringe spacing).

Frequency changes undergone by the fringe pattern 70 (i.e., changes in the fringe spacing) are slow in response to changes in the measuring beam frequency, but phase changes undergone by the fringe pattern (i.e., changes in the location of the fringes within the fringe pattern) are much faster. The fringe pattern 70, which models differences between the two reference surfaces 20 and 22 (i.e., their relative inclination) undergoes a regular change in phase as a function of a regular change in distance (i.e., spacing between the reference surfaces 20 and 22) from one end of the pattern 70 to the other. Intensity data from any one data point in the pattern 70 can be referenced instantaneously to other regularly spaced data points in the pattern 70 for determining the relative phases of the data points in the pattern. The phase determination can be simplified by sampling four evenly spaced divisions of a single fringe. This is virtually the same information that would be available from a conventional phase-shifting procedure that regularly varies distance through the equivalent of one fringe spacing.

Changes in interference phase that result from variations in the frequency of the secondary measuring beam 40 can be measured by comparing intensity variations within interference patterns formed by the different beam frequencies. The phase of a data point in a given interference pattern can be measured by evaluating the intensities of data points evenly distributed throughout one complete cycle of interference (i.e., one fringe spacing) according to a conventional phase shifting algorithm.

Assuming an even distribution of light throughout the sampled length of the interference fringe pattern, the phase ø of a selected point in the interference pattern can be determined in accordance with the following equation:

$$\phi = \tan^{-1}\left(\frac{I_2 - I_4}{I_1 - I_3}\right)$$

where $I_1$, $I_2$, $I_3$, and $I_4$ are intensities of data points spaced apart by 0, $\pi/2$, $\pi$, and $3\pi/2$ radians of phase as four equal divisions of one fringe spacing. The four intensities are collected by the fibers 62, 64, 66, and 68 of the detector 60 at the $\pi/2$ phase spacing. A linear array of sensors or other combination of sensors could also be used to gather the intensity data in distinct positions within the interference fringe pattern. The phase ø of common data points in the different interference patterns are comparable as phase offsets. The phase-offset comparisons are preferably made between the data points of the reference surfaces 20 and 22 separated by the nominal optical path length $D_2$. Such phase offsets could also be determined from other arrangements of the sampled data points including sampled data at irregular spacing using as few as three data points, but the calculations are more complicated. Other algorithms for converting interference data into measures of phase offset are described in a paper entitled Generalized Data Reduction for Heterodyne Interferometry by J. E. Greivenkamp, Optical Engineering, 23(4), 350-352, July/August 1984, which is hereby incorporated by reference.

The cavity 52 has a free spectral range $\Delta v_2$ based on the nominal optical path length $D_2$ separating the references surfaces 20 and 22 as follows:

$$\Delta v_2 = \frac{c}{2D_2}$$

A change in measuring beam frequency through the frequency spacing (FSR) $\Delta v_1$ between modes of the lasing cavity 26 can be expected to result in a change of phase offset $\Delta\emptyset$ of the interference pattern 60 produced by the measuring cavity 50 as follows:

$$\Delta\phi = \text{modulo } 2\pi\left(\frac{4\pi D_2 \Delta v_1}{c}\right)$$

where the change in phase offset $\Delta\emptyset$ is considered as a function of modulo $2\pi$ because measures of phase derived from local variations in intensity are unambiguous only within an angular interval equal to $2\pi$.

By substitution, it can be noted that the expected change in phase offset $\Delta\emptyset$ can also be rewritten as a ratio of the free spectral ranges of the lasing cavity 26 and the measuring cavity 52 as follows:

$$\Delta\phi = \text{modulo } 2\pi\left(\frac{2\pi\Delta v_1}{\Delta v_2}\right)$$

Accordingly, if the free spectral ranges $\Delta v_1$ and $\Delta v_2$ equal each other or are integer multiples of one another, then the expected changes in phase offset $\Delta\emptyset$ equal zero for intended measuring beam frequency shifts through $\Delta v_1$ or multiples of $\Delta v_1$. For example, if the free spectral range (i.e., frequency spacing) $\Delta v_1$ of the lasing cavity 26 is an integer multiple of the free spectral range $\Delta v_2$ of the measuring cavity 52, then every incremental frequency shift through $\Delta v_1$ can be expected to result in no changes of phase within the measuring cavity 50. Similarly, if $\Delta v_2$ is an integer multiple of $\Delta v_1$, then each such multiple of $\Delta v_1$ can be expected to result in a zero phase change.

In practice, a number of variables including laser inputs, environmental conditions, and manufacturing tolerances can affect the beam frequencies that are amplified within the lasing cavity 26 in association with each mode. Even if tuning is available for selecting among the different frequency modes of the lasing cavity 26, the particular frequencies output from the tunable laser source 24 can vary within limited ranges. Preferably, the free spectral range $\Delta v_2$ of the measuring cavity 52 is at least as large or larger than the limited range through which output beam frequencies can be expected to vary with respect to the nominal frequencies of each mode.

Beam frequency shifts that depart from integer multiples of the intended frequency spacing $\Delta v_1$ between lasing cavity modes are associated with non-zero changes in phase $\Delta\emptyset$ within the measuring cavity 52. The non-zero changes in phase $\Delta\emptyset$ can be converted into measures of beam frequency errors $v_E$, arising as departures from the expected shifts in beam frequency as follows:

$$v_E = \frac{c\Delta\phi}{4\pi D_2}$$

or by substitution:

$$v_E = \frac{\Delta v_2 \Delta\phi}{2\pi}$$

Thus, by knowing the nominal distance $D_2$ between the reference surfaces 20 and 22 or the free spectral range $\Delta v_2$ of the measuring cavity 52, detected phase changes $\Delta\emptyset$ can be converted into measures of beam frequency departures $v_E$ from the expected shifts in measuring beam frequency through the frequency spacing of $\Delta v_1$. From an inspection of the latter equation, it is also apparent that the free spectral range $\Delta v_2$ must be larger than the beam frequency departures $v_E$ to unambiguously measure the beam frequency departures $v_E$ as a phase change of less than $2\pi$.

Thus, the spacing $D_2$ of the measuring cavity 52, which is preferably an integer multiple of the spacing $D_1$ of the lasing cavity 24 should meet the conditions of the following inequality for making unambiguous measurements of the beam frequency departures $v_E$:

$$D_2 < \frac{c}{2v_E}$$

Preferably, the spacing $D_2$ is as large as possible within the above ambiguity constraint so that the detected phase changes $\Delta\emptyset$ provide the finest measures of beam frequency change. However, a determination of the actual frequency shift effected by a change in the inclination of the diffraction grating 30 requires in addition to the measure of the beam frequency departure $v_E$, a knowledge of the direction of the beam frequency change, the number of modes through which the change is made, and the nominal frequency spacing $\Delta v_1$ between the modes. Calibrations of the frequency tunable laser 24 together with a monitoring of the inclination of the diffraction grating 30 or other frequency adjuster can be used to supply this information. For example, feedback from a grating controller 74 to a processor 76 or the instructions of the processor 76 to the grating controller 74 can be interpreted for determining the direction of the intended frequency shift as well as the number of modes through which the shift is intended.

Figure 3:
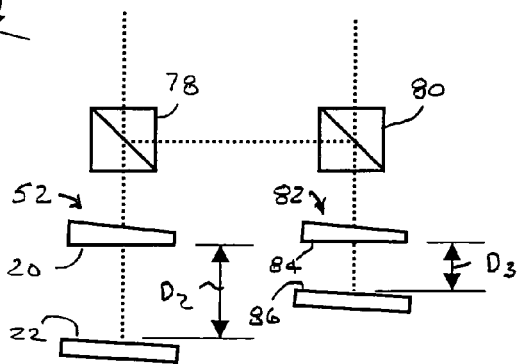
FIG. 3 is a diagram showing an alternative cavity arrangement for the distance-shifting interferometer.

Alternatively, a smaller cavity 52 having a larger free spectral range or, more preferably, a second measuring cavity 82 coupled to the first measuring cavity through beamsplitters 78 and 80 as shown in FIG. 3 can be used to measure both the direction and the number of modes through which the measuring beam frequency is shifted. A nominal optical path length difference $D_3$ separating reference surfaces 84 and 86 is preferably chosen to unambiguously measure a range of frequencies corresponding to at least two frequency spacings $\Delta v_1$ that separate each frequency mode from its two nearest neighbors as follows:

$$D_3 < \frac{c}{4\Delta v_1}$$

or by substitution:

$$D_3 < \frac{D_1}{D_2}$$

In addition to measuring frequency, the same interferometric information can be used to measure overall intensity variations of the secondary measuring beam 40. Generally, it is assumed that the same intensity variations among the different frequency outputs are apparent throughout the transverse dimensions of the beams. The intensity information can be extracted from the fringe pattern 70 by measuring the amplitudes of the fringes. Changes in the amplitudes of the fringes within the same transverse location in the measuring beam can be used as a measure of intensity variations between different measuring frequencies of the secondary measuring beam 40.

The frequency and intensity information gathered from the secondary measuring beam 40 can be communicated to the processor 76 for influencing the operation of the frequency-shifting interferometer 12. For example, the frequency and intensity information can be used as a feedback signal to the driver 74 for adjusting the angular orientation of the diffraction grating 30. Alternatively, the frequency and intensity information can be used to better interpret the interference results gathered by the camera 48.

Computer processing is simplified by stepping the measuring beam 34 through a series of evenly spaced (e.g., $\Delta v_1$ or an integer multiple of $\Delta v_1$) measuring beam frequencies. However, comparable results can be obtained at irregularly stepped beam frequencies, if the departure from regularity (e.g., $v_E$) is known. The measures of overall beam intensity variations can be used to normalize the intensity data collected at the different beam frequencies. An example of computer processing of irregularly stepped beam frequencies in a frequency-shifting interferometer is disclosed in further detail in co-assigned US Application entitled PHASE-RESOLVED MEASUREMENT FOR FREQUENCY-SHIFTING INTERFEROMETRY, filed on even date herewith and hereby incorporated by reference.

Although both above-described interferometers 12 and 14 are common path interferometers, as is preferred, other types of interferometers can also be used including Michelson and Mach-Zehnder interferometers. The preferred measuring cavity 52 operates under conditions of retroreflection could also be operated for further transmitting interfering reference beams. The invention is also particularly applicable for used with incrementally tunable laser in which the tuning can be accomplished in a variety of ways. These and other variations as will be apparent to those of skill in the art in accordance with the teachings of this invention.

The invention claimed is:

1. A beam monitoring system for a mode-selective tuner comprising:
    a beamsplitter for diverting a portion of each of a plurality of measuring beams that are output from the mode-selective tuner at different frequency modes;
    a distance-shifting interferometer for producing interference patterns at each of the different frequency modes and having a pair of reference surfaces that establish (a) a nominal optical path length difference between interfering parts of the diverted measuring beam portion and (b) a variation in the nominal optical path length difference between corresponding points on the two reference surfaces spanning nearly at least one fringe of the interference patterns;
    a detector that samples the interference patterns at the corresponding points on the two reference surfaces; and
    a processor that converts variations in the interference patterns into measures of beam frequency variation;
    wherein the different frequency modes of the mode-selective tuner have a first free spectral range, the nominal optical path length difference between corresponding points on the two reference surfaces has a second free spectral range, and the first and second free spectral ranges are related by an integer multiple.

2. The system of claim 1 in which the detector includes an array of sensors that can be oriented in a direction of fringe variation within the interference patterns.

3. The system of claim 2 in which the sensors are spaced apart by fractional parts of a fringe for gathering intensity information that is converted into measures of phase offsets for the different measuring beams.

4. The system of claim 3 in which the processor employs a conventional phase-shifting algorithm for converting the intensity information from the sensors into the measures of phase offsets.

5. The system of claim 3 in which the array of sensors is rotatable for adjusting the fringe spacing between the detectors.

6. The system of claim 1 in which the processor gathers information from the mode-selective tuner in addition to information from the detector to provide unambiguous measures of beam frequency shifts between the different frequency modes.

7. The system of claim 1 in which the processor provides feedback to the mode-selective tuner for adjusting the frequency output of the mode-selective tuner.

\* \* \* \* \*